(12) United States Patent
Gao

(10) Patent No.: US 11,930,625 B2
(45) Date of Patent: Mar. 12, 2024

(54) THERMAL MANAGEMENT SYSTEM AND METHOD FOR POWER OPTIMIZATION FOR COOLING AN ELECTRONIC RACK

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 287 days.

(21) Appl. No.: 17/214,689

(22) Filed: Mar. 26, 2021

(65) Prior Publication Data

US 2022/0312646 A1    Sep. 29, 2022

(51) Int. Cl.
*H05K 7/20* (2006.01)
*G05D 23/19* (2006.01)

(52) U.S. Cl.
CPC ......... *H05K 7/20836* (2013.01); *G05D 23/19* (2013.01); *H05K 7/2039* (2013.01)

(58) Field of Classification Search
CPC .. H05K 7/20836; H05K 7/2039; G05D 23/19; G06F 1/20; G06F 1/28; G06F 1/3203; G06F 2200/201; G06F 1/206
See application file for complete search history.

(56) References Cited

U.S. PATENT DOCUMENTS

| | | | |
|---|---|---|---|
| 10,693,052 B2 * | 6/2020 | Harding | H05K 7/20736 |
| 2005/0052196 A1 | 3/2005 | Borkar | |
| 2015/0082811 A1 | 3/2015 | Rangarajan et al. | |
| 2016/0033975 A1 | 2/2016 | Mittal et al. | |
| 2017/0338393 A1 * | 11/2017 | Nakagawa | H10N 10/17 |

FOREIGN PATENT DOCUMENTS

| | | |
|---|---|---|
| JP | 10831994 A | 2/1996 |
| JP | 2001156228 A | 6/2001 |
| JP | 2017527889 A | 9/2017 |
| JP | 2020124110 A | 8/2020 |
| JP | 2022046739 A | 3/2022 |
| JP | 2023512380 A | 3/2023 |

* cited by examiner

*Primary Examiner* — Tejal Gami
(74) *Attorney, Agent, or Firm* — WOMBLE BOND DICKINSON (US) LLP

(57) ABSTRACT

According to one embodiment, a thermal management system includes a thermoelectric cooling (TEC) element mounted on an information technology (IT) component, wherein the element draws a first power to cool the component; a load sensor to sense a second power that is drawn by the component to perform a first set of operations; a temperature sensor to sense a temperature of the component; and a controller to determine whether the second power drawn has changed based on the load sensor, wherein the component performs a second set of operations while drawing the second power, and in response to the changed second power, adjust the power supplied to the element and component based on the temperature and the power supplied to the component, such that the component continues to perform the second set of operations while drawing the adjusted power that is less than the power drawn before the adjustment.

20 Claims, 6 Drawing Sheets

THERMAL MANAGEMENT SYSTEM AND METHOD FOR POWER OPTIMIZATION FOR COOLING AN ELECTRONIC RACK

FIELD

Embodiments of the present disclosure relate generally to a thermal management system for power optimization for cooling an electronic rack.

BACKGROUND

Thermal management for a data center that includes several active electronic racks is critical to ensure proper performance of servers and other information technology (IT) equipment (e.g., performing IT data processing services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use cooling air to cool the IT equipment. The cooling air is recirculated using cooling units that extract heat captured by the cooling air. One commonly used cooling unit is a computer room air conditioning (CRAC) unit that is a device that intakes hot exhaust air and supplies cooling air into the data center to maintain the data center's thermal environment. The CRAC is an air cooling unit that is widely used in existing air cooled data centers, and there are many other types of solutions for air cooled data centers. Also, a majority of existing data centers are air cooled.

Recently, data centers have been deploying more high-power density electronic racks, where more high-density chips are packaged closer together to provide more processing power. This is especially the case due to developments in artificial intelligence (AI) and cloud-based services, which require high performance and high power density processors, such as control processing units (CPUs) and graphic processing units (GPUs). Cooling these high power density processors is essential for maintaining power efficiency of the electronic racks. For example, electrical power drawn by the processors is converted into thermal power, which creates a higher core temperature. As the temperature increases, leakage current (or power leakage) increases, which may therefore decrease the overall power efficiency of the processors. In order to combat high temperatures to preserve power efficiency of the racks, cooling capacities of data centers may be increased (e.g., increasing the production of cooling air in a data center room to draw more heat away from the processors). Although chip efficiency may be preserved, power efficiency for the overall data center may suffer due to the excess cooling power required to keep the processors at a desirable temperature for preserving power efficiency of the chips.

As described herein, additional cooling power may be utilized by a data center in order to preserve chip efficiency by reducing or eliminating power leakage due to excessive core temperatures. To implement such a scheme, the data center may draw the necessary power from a utility (e.g., alternating current (AC) mains). To decrease dependency on the AC mains and reduce a carbon footprint, however, some facilities are turning to renewable power systems, such as a photovoltaic (PV) system that converts solar radiation into electrical direct current (DC) power. Unlike the AC mains from which extra power may be drawn, renewable power systems may provide a limited (constant) amount of power (e.g., for a limited time) with which electrical elements and cooling systems may be powered.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment of this disclosure are not necessarily to the same embodiment, and they mean at least one. Also, in the interest of conciseness and reducing the total number of figures, a given figure may be used to illustrate the features of more than one embodiment, and not all elements in the figure may be required for a given embodiment.

DETAILED DESCRIPTION

Figure 1:
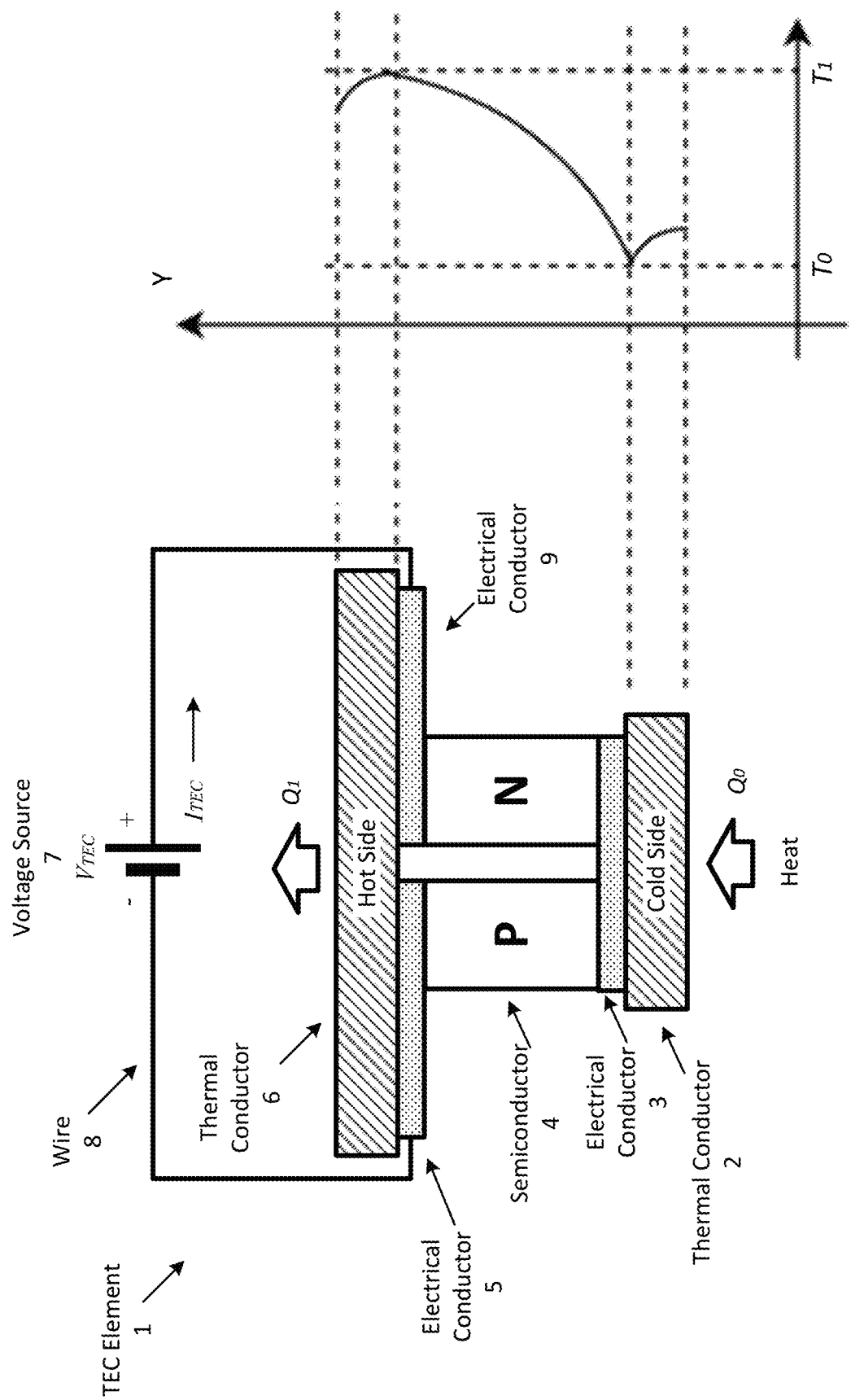
FIG. 1 is a block diagram illustrating an example of a TEC element (or TEC device) according to one embodiment.

Several embodiments of the disclosure with reference to the appended drawings are now explained. Whenever the shapes, relative positions and other embodiments of the parts described in a given embodiment are not explicitly defined, the scope of the disclosure here is not limited only to the parts shown, which are meant merely for the purpose of illustration. Also, while numerous details are set forth, it is understood that some embodiments may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problem of efficiently cooling electrical components (e.g., processors or chips) to reduce power leakage by implementing a thermal management and control system, which may be powered by a limited power source, for optimizing power for cooling (e.g., high-power density) electronic racks that may be populated within a data center room as well as optimizing computing power usage efficiency. The solution proposed in the current disclosure provides a thermal management and control system (or thermal management system) that deploys one or more thermoelectric cooling (TEC) elements (or TEC devices) that are mounted on one or more information technology (IT) component (e.g., processors) of an electronic rack, and optimizes power distribution between each TEC element and each IT component in order to drive the IT components efficiently (e.g., reducing power leakage). For instance, an IT component and a TEC element may be electrically coupled to a limited power source, such as a photovoltaic (PV) system that produces electrical direct current (DC) power from solar radiation. During operation, the TEC element may draw power from the power source to cool the IT component, and the IT component may draw power from the same limited power source to perform one or more computational operations. Thus, during operation, both the TEC element and the IT component may share a limited amount of energy that the power source is able to provide. The system determines a temperature reading of the IT component and determines a computing workload of the IT component. For example, the system may include a load detector that senses a load current supplied to the IT component from a power source. From the workload and the temperature reading, the system determines an optimal operational temperature (or temperature threshold) at which power is optimally distributed between the IT component and the TEC element, while maximizing the computing power efficiency of the IT component by minimizing (or eliminating) power leakage. The system then distributes power to the TEC element to adjust (e.g., increase) the cooling capacity of the system in order to cool the IT component such that the temperature reading may match (or be within a range of) the optimal operational temperature. Thus, the design optimizes power distribution to the IT component and TEC element by maximizing the amount of power provided to the IT component, while minimizing the amount of power to the TEC element that is necessary to eliminate (or reduce) the leakage power produced by the IT component. By maximizing the amount of power drawn by the IT component this enables the IT component to operate in a high-power operational condition in which higher power may be used by the IT component as kinetic power (e.g., computing power), and at the same time maintaining a proper temperature. Moreover, with limited power availability from the limited power source, this optimized cooling scheme better utilizes the source while at the same time optimizing performance of the IT component during times high-power conditions.

According to one embodiment, a thermal management system for an electronic rack includes: a thermoelectric cooling (TEC) element that is mounted to an information technology (IT) component of the electronic rack, wherein the TEC element and the IT component are electrically coupled to a power source, wherein the TEC element draws a first input power from the power source to cool the IT component; a load sensor that is arranged to sense a second input power that is drawn by the IT component from the power source to perform a first set of operations; a temperature sensor that is arranged to sense a temperature of the IT component; and a controller that is configured to determine whether the second input power drawn by the IT component has changed based on the load sensor, wherein the IT component performs a second set of operations while drawing the second input power, and in response to the changed second input power, adjust the first input power and the changed second input power that are drawn by the TEC element and the IT component, respectively, based on the temperature and the changed second input power, wherein the IT component continues to perform the second set of operations while drawing the adjusted second input power that is less than the changed second input power.

In one embodiment, the power source is a photovoltaic (PV) system that includes a PV panel that is arranged to convert solar radiation into output power for the IT component and the TEC element.

In another embodiment, the TEC element and the IT component are electrically coupled in parallel to the power source, wherein the thermal management system further comprises a power adjusting device that is coupled between the power source and the TEC element, wherein the controller adjusts the first and second input powers by transmitting a control signal to the power adjusting device to provide the first adjusted input power drawn to the TEC element. In some embodiments, the adjustment of the second input power is in response to the power adjusting device providing the first adjusted input power to the TEC element and is inversely proportional to the adjustment of the first input power. In one embodiment, the power adjusting device is either an adjustable resistance device or a power switching device.

In one embodiment, the controller is configured to determine a temperature threshold at which the IT component is to operate while performing the second set of operations by using the changed second input power to perform a table lookup into a data structure that associates input power values with temperature thresholds, wherein the controller adjusts the first input power and the changed second input power based on a difference between the temperature threshold that is associated with the changed second input power and the temperature sensed by the temperature sensor.

According to another embodiment, a method for cooling an information technology (IT) component includes determining a first input power drawn from a power source by an active IT component that is performing a set of operations, wherein coupled to the IT component is a thermoelectric cooling (TEC) element that draws a second input power from the power source to cool the active IT component; receiving a temperature reading of the IT component from a temperature sensor; determining whether the first and second input powers are to be adjusted, based on the temperature reading and the first input power; and in response to determining that the first and second input powers are to be adjusted, adjusting the first and second input powers that are drawn by the IT component and TEC element, respectively, such that the IT component continues to perform the set of operations while drawing the adjusted first input power that is less than the first input power.

In one embodiment, the power source is a photovoltaic (PV) system that includes a PV panel that is arranged to convert solar radiation into output power for the IT component and the TEC element. In another embodiment, the TEC element and the IT component are electrically coupled in parallel to the power source device, wherein coupled between the TEC element and the power source is a power adjusting device, wherein adjusting the first and second input powers comprises transmitting a control signal to the power adjusting device to provide the adjusted second input power to the TEC element. In some embodiments, the adjustment of the first input power is in response to the power adjusting device providing the adjusted second input power to the TEC element and is inversely proportional to the adjustment of the second input power. In one embodiment, the power adjusting device is either an adjustable resistance device or a power switching device.

In one embodiment, determining whether the first and second input powers are to be adjusted comprises: determining a temperature threshold at which the IT component is to operate while performing the set of operations by using the first input power to perform a table lookup into a data structure that associates input power values with temperature thresholds; and determining whether the temperature reading exceeds the determined temperature threshold that is associated with the first input power. In another embodiment, determining the first input power drawn from the power source by the active IT component comprises determining a computing workload of the IT component that includes the set of operations that are to be performed by the IT component, wherein the first input power is determined according to the computing workload.

According to another embodiment, a non-transitory machine-readable medium having instructions stored therein, which when executed by a processor causes the processor to perform operations that are similar to the operations performed in the method described herein.

In one embodiment, as used herein, to "couple" one component (or element) to another component may refer to "electrically" coupling (e.g., via one or more wires) the two electronic components so that electrical current may flow from one component to another, such that power is supplied to a load of the other component.

FIG. 1 is a block diagram illustrating an example of a TEC element (or TEC device) according to one embodiment. This figure shows a TEC element 1 that has (at least) two semiconductors 4, a p-type semiconductor and a n-type semiconductor, having different electron densities (e.g., n-type>p-type). These semiconductors may be arranged as pillars that are placed thermally in parallel to each other, and electrically in series by an electrical conductor 3 that is connected to a thermal conductor 2. Each end of the semiconductors that is not connected to the electronic conductor 3 is connected to a separate conductor. In particular, the p-type semiconductor is connected to an electrical conductor 5, while the n-type semiconductor is connected to another electrical conductor 9, which is separate from conductor 5. Both of the electrical conductors 5 and 9 are connected to another terminal conductor 6. In addition, the electrical conductor 5 is electrically coupled to a negative terminal of a voltage source 7 and the electrical conductor 9 is electrically coupled to a positive terminal of the voltage source (e.g., via one or more wires 8). In one embodiment, the voltage source may be an external voltage source (e.g., separate from the TEC element 1). In another embodiment, the voltage source and the TEC element may be coupled to one another. For example, both elements may be a part of an electrical component (e.g., both mounted on a PCB board). In some embodiments, the voltage source may be a part of power source 21 and/or one or more controllers, such as the controller 28, as shown in FIG. 2.

In one embodiment, any of the components of the TEC element may be composed of any (known) material. For example, the thermal conductors 2 and 6 may be made of a ceramic material, which can conduct heat but not electricity. As another example, the electrical conductors 3, 5, and/or 9 may be composed of any conductor material (e.g., copper, etc.).

The TEC element is arranged to move heat from one surface to another surface, at the cost of extra external electrical power, $P_{TEC}$. Specifically, when a voltage, $V_{TEC}$, is applied by the voltage source 7 across the two electrical conductors 5 and 9, a current, $I_{TEC}$, passes through the semiconductors, causing the TEC element to transfer heat $Q_0$ from the "cold side" to the "hot side". Thus, the power applied to the TEC, $P_{TEC}=V_{TEC}*I_{TEC}$. A temperature difference is generated by the semiconductor 4 as current passes through it, as shown by $T_0-T_1$. The heat that is ultimately expelled out of the hot side is $Q_1$, which may be greater than $Q_0$ because $Q_1$ may include $Q_0$ and any heat, $Q'$ that is generated by the TEC element while the TEC is active. In other words, $Q_1=Q_0+Q'$. Thus, during operation as part of a thermal management system as described herein, the thermal conductor 2 may be coupled to (e.g., mounted on) an IT component, such that the TEC element draws $Q_0$ generated by the IT component away from the component and into the thermal conductor 6. Drawing this heat away from the IT component thus cools the IT component while it is active (e.g., performing one or more computational operations) and the TEC element is operational.

Figure 2:
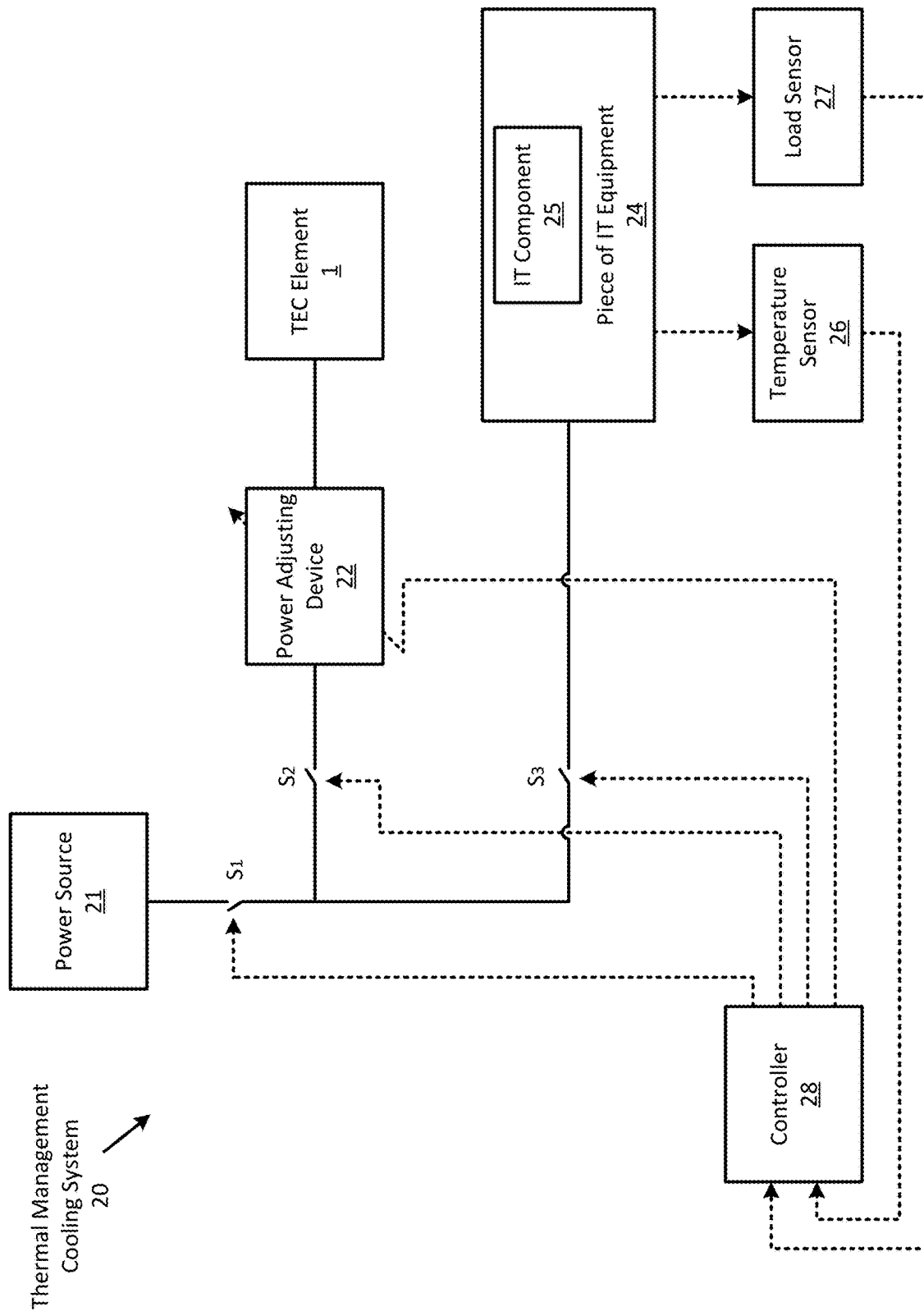
FIG. 2 is a block diagram illustrating an example of a thermal management cooling system that includes a TEC element for cooling information technology (IT) components according to one embodiment.

FIG. 2 is a block diagram illustrating an example of a thermal management system 20 that includes the TEC element 1 for one or more cooling information technology (IT) components 25 according to one embodiment. In particular, this figure shows a thermal management system 20 that is configured to optimize power distribution between the TEC element 1 and the IT component 25. As shown, the system includes the TEC element 1, a power source 21, a power adjusting device 22, a piece of IT equipment 24, the IT component 25, a temperature sensor 26, a load sensor (or detector) 27, and a controller 28.

As shown, a component arrangement of the thermal management system 20 is designed such that the TEC element and IT component draw power from the power source. In particular, the power source 21 is coupled to the TEC element 1, and is coupled to the IT component (via the piece of IT equipment). Specifically, the power source 21 may be coupled to the piece of IT equipment, whereby the piece of IT equipment may route power to the IT component mounted thereon (e.g., via one or more trace wires). In one embodiment, the power source may be coupled directly to the IT component. As illustrated, both the TEC element and the IT component are coupled to the power source in parallel, and are arranged to draw input power from the source. Coupled between the power source and the TEC element is the power adjusting device 22. In addition, the thermal management system includes several switches, $S_1$-$S_3$, where $S_1$ is coupled between the power source and both parallel branches, $S_2$ is coupled between the power adjusting device and $S_1$, and $S_3$ is coupled between the IT component and $S_1$. In one embodiment, the thermal management system arrangement may be different. For example, the system may include more or less switches.

In one embodiment, each of the elements may be separate electrical devices (e.g., which may be coupled or mounted to one another), as illustrated in this figure. In another embodiment, at least some of the elements may be a part of one or more elements, such as being contained within a shared housing. For example, the temperature sensor 26 may be a part of the IT component 25, as described herein.

The power source 21 may be any type of power source that is designed to provide power to one or more elements of the thermal management system 20. For example, the power source may be a "limited" power source in which the source produces a total output power, $P_{total}$, as a limited (or constant) amount of power for a given number of components that are electrically coupled to the source. In one embodiment, the power source may be any type of renewable energy source, such as a PV system that includes one or more PV panels that are arranged to convert solar radiation into electrical DC output power, as $P_{total}$, for the system (e.g., the TEC element 1 and/or the IT component 25). In one embodiment, the (e.g., power source of the) thermal management system may include additional elements, such as a DC-to-DC converter (not shown) that is coupled between the PV panel and at least some of the other elements, and is configured to convert the output voltage of the PV panel into an output voltage of the DC-to-DC converter. In some embodiments, the converter may be a buck converter, a boost converter, or a buck-boost converter. In another embodiment, the power source may include other renewable energy sources, such as one or more wind turbines that are designed to convert wind energy into electrical power. In another embodiment, the PV system may include one or more batteries that are charged to store energy produced by the PV panels to be used later to power one or more loads, as described herein. In another embodiment, the power source may be designed to provide AC power, such as a generator. In some embodiments, the power source may be utility power (e.g., alternating current (AC) mains). In this case, the utility power may be a limited power source under power capping conditions.

In some embodiments, the thermal management system 20 may include two or more power sources. For example, the system may include a PV system and one or more batteries, such that the system may draw power from either the PV system, the batteries, or a combination thereof.

The power adjusting device 22 may be any device that is designed to adjust (e.g., increase or decrease) the amount of input current (or input power) that flows from the power source 21 to the TEC element in response to receiving a control signal. Specifically, an adjustment by the device may adjust input power to both the IT component and the TEC element. For example, an adjustment may increase current flow from the power source to the TEC element, while (e.g., contemporaneously) current supplied to the IT component may decrease (e.g., inverse proportionally). This proportionality may be the result of the power source being a limited power source in which both the TEC element and the IT component share $P_{total}$ provided by the source. In one embodiment, the adjusting device may be an adjustable resistance device (e.g., a digital variable resistor or potentiometer) of which its electric resistance value may be adjusted in order to increase or decrease the current flow. In another embodiment, the adjusting device may include a high-power switch (e.g., a power metal-oxide-semiconductor field-effect transistor (MOSFET)) that may reduce (or increase) an average input current flowing from the power source and into the TEC element based on a duty cycle of a pulse-width modulation (PWM) signal. More about controlling the power adjusting device is described herein.

In one embodiment, the piece of IT equipment 24 may be any element (such as a PCB) that is arranged to hold one or more IT components 25 and/or any type of electrical component, such as a controller. In another embodiment, the IT component may be any electrical component (e.g., a processor, etc.) that is designed to perform data processing tasks (or computing operations). More about the IT component and piece of IT equipment is describe herein.

In one embodiment, the thermal management system 20 may be an air-cooled system in which the TEC element may dissipate the heat drawn from the IT component into the ambient environment in order to cool the IT component. In this case, the TEC element may be coupled to (or mounted on) the IT comment, and a heat sink (not shown) may be stacked on top of the TEC element. For this design, the heat sink may receive heat from the TEC element and then to transfer (or reject) the heat into the air. In another embodiment, the system may be a liquid-cooled system in which the TEC element is used in conjunction with a liquid-cooling device (e.g., a cold plate) that is mounted on the IT component and/or the TEC element. For example, a cold plate may be stacked on top of the TEC element, while the TEC element is mounted on the IT component. In this design, the TEC may transfer heat drawn away from the IT component and into liquid coolant that is flowing through the cold plate. In another design, the cold plate may be disposed between the TEC element and the IT component. In this instance, the system may deploy a hybrid cooling design in which the cold plate transfers at least some heat from the IT component into liquid coolant, while the TEC element may be arranged to draw heat from the cold plate and/or the IT component into a heat sink that dissipates the heat into the ambient environment via one or more heat sinks mounted on the TEC element and/or cold plate.

In one embodiment, the TEC element 1 may be designed to handle different power ranges based on the thermal management system's needs. For instance, the TEC element may be designed to draw and dissipate a low heat load, or may be designed to dissipate high heat loads. In one embodiment, the TEC element may be associated with a coefficient of performance (COP), where COP is equal to a removed heat load from the IT component (e.g., $Q_0$) divided by the input power of the TEC element. Thus, as COP grows, less input power is need to drive the TEC element to remove a same amount of heat generated by the IT component. In one embodiment, optimal power distribution of the thermal management system may be based on a maximum COP of the TEC element, such that minimal input power is necessary to cool the system.

As described herein, the TEC element 1 may draw electrical power (e.g., from the power source 21), as $P_{TEC}$, to transfer heat from a cold side of the TEC element to a hot side (and ultimately through a heat sink, for example). In one embodiment, the TEC element may be a part of a TEC system (which is a part of the thermal management system) that draws more power from the power source to provide cooling capabilities. For example, when the system is air-cooled, the TEC system may include one or more fans that are arranged to push (or pull) air over the heat sink (and TEC element) in order to improve heat transfer. As another example, when the system is liquid-cooled, the TEC system may include one or more liquid pumps that are arranged to supply (or draw) liquid coolant through one or more cold plates. Thus, $P_{TEC}$ may also include additional power required by other elements of the TEC system, such as one or more fans and one or more pumps. In another embodiment, the $P_{TEC}$ may also include electrical energy required to operate one or more controllers (e.g., controller 28).

The temperature sensor 26 is any be any type of sensor that is designed to sense temperature of the IT component 25 (and/or the piece of IT equipment 24), and is configured to produce an electrical signal that represents the temperature reading. For instance, the sensor may sense a case temperature of the IT component. In one embodiment, the sensor may be a separate electrical component. In another embodiment, the sensor may be a part of the IT component and/or the piece of IT equipment. In some embodiments, the thermal management system may include additional temperature sensors. For instance, the system may include a sensor that is arranged to sense an ambient temperature. In one embodiment, the temperature reading of the IT component may represent the temperature of the component while the TEC element 1 is cooling the component. Thus, a lower temperature reading may correlate to the TEC element drawing more power from the power source to increase cooling capabilities.

The load sensor 27 may be any type of sensor that is designed to sense a (computing) workload of the IT component 25, and is configured to produce an electrical signal that represents the workload. Specifically, the load sensor may sense an input power that is drawn by the IT component from the power source to perform a set of operations. For example, the load sensor may be a current sensor that senses a load current that the IT component is drawing from the power source. In another embodiment, the load sensor may sense the workload from the controller 28 that may be communicatively coupled with the IT component. In another embodiment, the load sensor may be configured to determine an input power of the IT component by sensing the computing workload of the IT component that includes a set of operations (e.g., functions or tasks) that are to be (or are being) performed by the IT component. For example, the load sensor may determine the computing workload from the controller 28, which may indicate the IT component's performance (e.g., the clock speed of the IT component). From the determined computing workload, the load sensor may determine the input power of the IT component that will be required to perform the operations (e.g., by performing a table lookup using the computing workload into a data structure that associates workloads with power requirements).

The controller 28 may be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). In one embodiment, the controller may be a circuit with a combination of analog elements (e.g., resistors, capacitors, inductors, etc.) and/or digital elements (e.g., logic-based elements, such as transistors, etc.). The controller may also include memory. As shown, the controller 28 is communicatively coupled to the temperature sensor 26 and the load sensor 27 to receive one or more electrical signals indicating a temperature reading of the IT component 25 and a current load of the IT component, respectively. The controller is also communicatively coupled to the three switches $S_1$-$S_3$ and to the power adjusting device 22. For instance, the controller may be coupled via a wired connection to the elements.

In one embodiment, the controller 28 may be configured to perform one or more power optimization operations for determining an optimal power distribution between the TEC element and the IT component in order to maximize the available (but limited) power provided by the power source 21, while minimizing power required by the TEC element and minimizing power leakage by the IT component. Specifically, for the IT component to perform in high-power conditions (e.g., times at which a significant amount of load current is required to perform computational operations), the IT component may require a maximum amount of input power from the power source 21. When drawing high power, however, the core temperature of the IT component increases. This results in the input power of the IT component, $P_{component}$, (e.g., drawn from the power source) being a combination of power leakage, $P_{leak}$, of the component, which increases due to the increase in core temperature, and computing power, $P_{compute}$, which is power used by the IT component to perform the necessary computational operations. Thus, $P_{component}=P_{leak}+P_{compute}$. The controller is configured to determine a temperature threshold (or temperature range) at which the TEC element may cool the IT component while operating in high-power conditions that enables the component to maximize $P_{compute}$ and minimizing (or eliminating) $P_{leak}$, while also minimizing $P_{TEC}$. With cooling the IT component to the temperature threshold, the IT component draws less power from the power source, due to at least the elimination of $P_{leak}$ (e.g., at the optimal temperature $P_{component}=P_{compute}$). As a result, the IT component may be able to perform the same operations under lesser power conditions, since the majority of the power drawn by the IT component is used to perform computations.

In another embodiment, the power optimization may enable the IT component to draw more power, and as a result perform more computational operations. As previously described, once the system reaches an optimal temperature, the IT component may draw $P_{compute}$, which may be less than $P_{component}=P_{leak}+P_{compute}$ (e.g., while the IT component isn't operating at the optimal operational temperature). As an alternative embodiment, the IT component may be configured to draw more power, $P_{extra}$, (where $P_{component}=P_{compute}+P_{extra}$), once $P_{TEC}$ is minimized. In one embodiment $P_{extra}$ may be the same as $P_{leak}$, such that the IT component may draw the same power as being the power distribution was optimized. In one embodiment, the IT component may be able to draw more power since the temperature threshold may be a range, allowing the IT component to generate more heat in response to drawing more power, so long as the temperature of the IT component stays within the range.

As an example, the controller receives a temperature reading from the temperature sensor 26, and receives the (current) input power of the IT component from the load sensor 27 (as electrical signals). The controller determines whether input power of the IT component and the TEC element are to be adjusted based on the temperature reading and the sensed input power of the IT component. In other words, the controller determines whether the TEC element requires more or less power in order to set the core temperature of the IT component to a temperature threshold that enables optimal performance. In one embodiment, to determine this the controller may use the input power of the IT component to perform a table lookup into a data structure that associates input power values with temperature thresholds (or ranges). In another embodiment, the controller may include a power optimization model (e.g., derived in a controlled setting), which outputs temperature thresholds in response to power values as input. Once determined, the controller may transmit a control signal to the power adjusting device 22 to provide the TEC element with more (or less) power in order to adjust the temperature of the IT component. For instance, when the power adjusting device is a variable resistor, to lower the power provided to the TEC element the control signal may increase the resistance. On the other hand, to increase the power input of the TEC element in order to decrease the temperature the control signal may decrease the resistance. As another example, when the power adjusting device is a power switch, the control signal may be a PWM signal, which when having a high duty cycle may cause the TEC element to receive more power in order to decrease the temperature. Thus, the controller may continue to adjust the input power until the temperature reading of the IT component is (or is within a range) of the temperature threshold.

In one embodiment, the controller may adjust the input power of both the TEC element 1 and the IT component 25 based on adjusting the power adjusting device 22, as previously described. Specifically, the power adjustment to the IT component may be in response to (e.g., being an automatic adjustment in response to) the adjustment to the input power of the TEC element. For example, during high-power conditions, the IT component may draw an input power that is equal to (or approximately) the total output power of the power source 21 (e.g., "X" Watts). In this case, as the controller adjusts the power adjusting device to provide the TEC element with more input power, the input power of the IT component may be adjusted in response to the controller's adjustment and may be inversely proportional to the TEC elements power adjustment. In other words, the TEC element may draw power from the power source that would otherwise be drawn by the IT component (e.g., the TEC element may draw "Y" Watts, while the IT component now draws "X−Y" Watts). In one embodiment, the reduction of input power to the IT component may at least partially correspond to the reduction in $P_{leak}$ that is the result of the IT component operating at the temperature threshold.

As illustrated herein, the thermal management system 20 includes several switches $S_1$-$S_3$ that are communicatively coupled to the controller 28 in order to receive control signals from the controller to control the state (e.g., open or closed) of the switches. In one embodiment, the controller controls the state of $S_1$ based on the operational sate of the power source. As described herein, the power source may be a PV system. In cases, however, where the PV system is not providing sufficient output power (e.g., during cloudy days or at night), the controller may open $S_1$ in order to prevent the power source from becoming a load. In this case, the thermal management system 20 may draw power from other sources, such as a battery (not shown). In another embodiment, the controller may control $S_2$ and $S_3$ under boundary conditions. For instance, the controller may close $S_3$ and open $S_2$ to initially provide full output power from the power source to the IT component. As the temperature rises, however, the controller may close $S_2$ in order to begin to provide the TEC element with power to cool the IT component.

In one embodiment, the system may include more or less elements as illustrated herein. As described herein, the TEC element is arranged to be coupled to (or mounted on) the IT component in order to draw heat away from the IT component while the component is active (e.g., performing one or more computations or operations). Both the TEC element and the IT component may be (electrically coupled) to the power source 21 in order to draw power. In some embodiments, the system may include one or more IT components, where at least some of the additional IT components may have TEC elements mounted therein such that the additional IT components and TEC elements may be coupled to the power source 21. As another example, the system may not include a load sensor, but the controller (or another electronic device) may perform load sensor operations to sense a workload of the IT component, as described herein.

Figure 3:
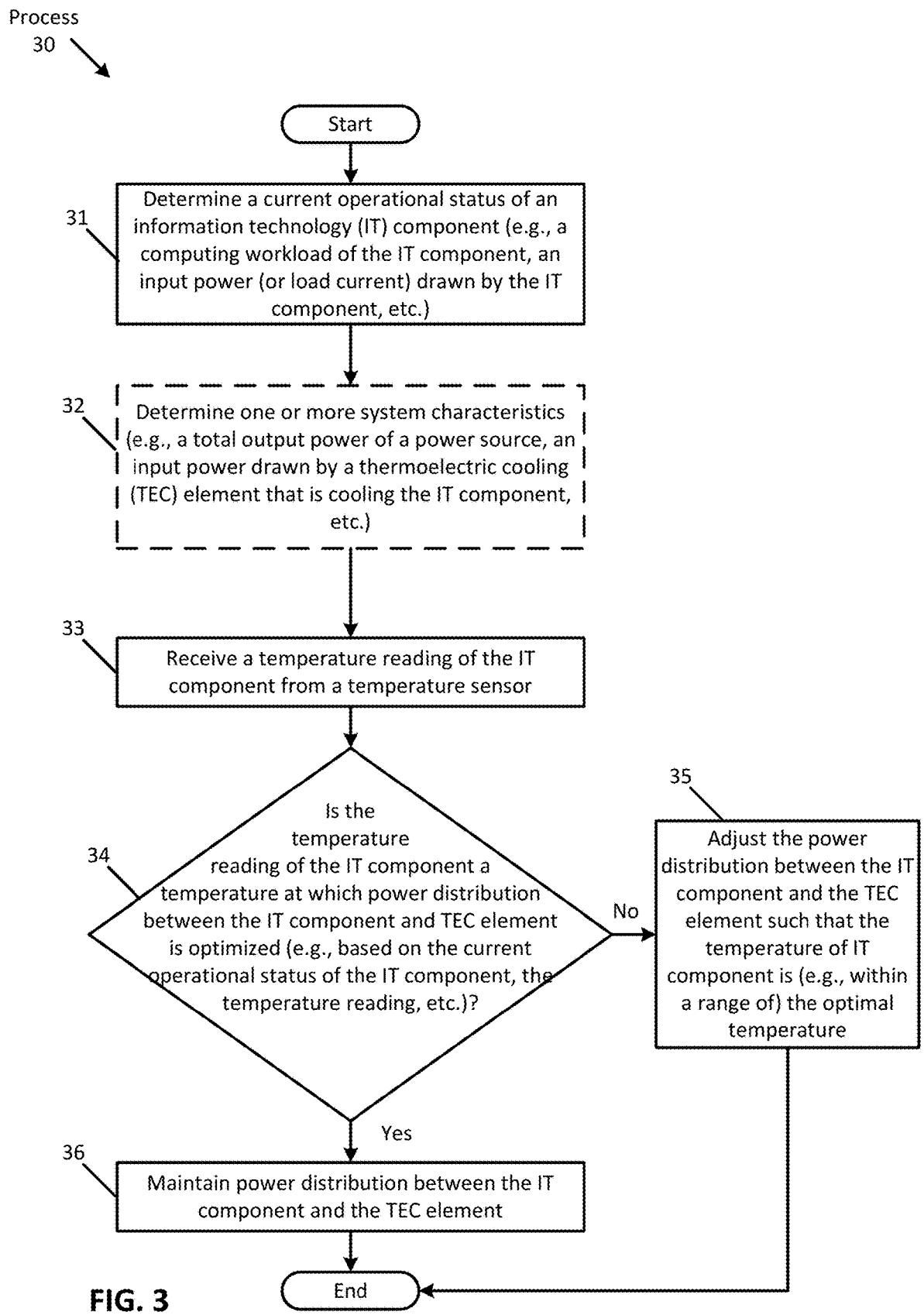
FIG. 3 is a flow chart of a process for distributing optimized power between the TEC element and IT component according to one embodiment.

FIG. 3 is a flow chart of a process 30 for distributing optimized power between the TEC element 1 and IT component 25 according to one embodiment. In one embodiment, at least some of the operations of process 30 may be performed by the controller 28 of FIG. 2.

The process 30 begins by the controller 28 determining a current operational status of an IT component (at block 31). Specifically, the controller may determine a computing workload of the IT component, an input power (or load current) drawn by the IT component while it is performing a set of operations, etc. For example, the controller may receive an electrical signal from the load sensor that represents a load current that is being supplied to the IT component. From the load current, the controller may determine the input power of the IT component, $P_{component}$. In another embodiment, the controller may determine the load current based on the computing workload that is to be performed (or is being performed by) the IT component. The controller may determine one or more thermal management system characteristics (at block 32). In one embodiment, the characteristics may include a total output power, $P_{total}$, of the power source, $P_{TEC}$ (or input current) drawn by the TEC element 1 to cool the IT component, an ambient temperature of the environment in which the thermal management system is located, a maximum COP of the TEC element, etc. In one embodiment, $P_{TEC}$ may be computed based on the total power of the power source 21, since $P_{total}=P_{component}+P_{TEC}$. The controller receives a temperature reading of the IT component from the temperature sensor 26 (at block 33).

The controller 28 determines if the temperature reading of the IT component a temperature at which power distribution between the IT component and the TEC element is optimized (at block 34). Specifically, the controller is determining whether input power drawn by the IT component and/or the TEC element needs to be adjusted to ensure that the IT component is at an optimal temperature at which power is optimally (or efficiently) distributed (e.g., by minimizing $P_{TEC}$ and $P_{leak}$ and/or maximizing $P_{compute}$, with respect to $P_{total}$). In particular, the controller may make this determination based on the current operational status of the IT component (e.g., $P_{component}$) and/or the temperature reading of the IT component. In another embodiment, the determination may be based on one or more system characteristics, such as $P_{TEC}$, $P_{total}$, and the ambient temperature. In one embodiment, the controller may determine a temperature threshold (or range) at which the IT component is to operate while performing (e.g., the same) operations under lower (more optimized) power conditions by using $P_{component}$ (which may be power drawn under less optimal power conditions, such that $P_{component}=P_{compute}+P_{leak}$) to perform a table lookup into a data structure that associates input power values with temperature thresholds (or ranges). In one embodiment, the determination may be also based on $P_{total}$. For example, the thermal management system (e.g., memory of the controller) may include a data structure for each (or a range of) potential $P_{total}$ of the power source.

If the temperature of the IT component 25 is not an optimal temperature (e.g., being equal to or within a range of the temperature threshold) at which power distribution is optimized, the controller 28 adjusts the power distribution between the IT component and the TEC element 1 such that the temperature of the IT component is (e.g., within a range of) the optimal temperature (at block 35). Specifically, the controller may adjust the input power of the TEC element 1 (by transmitting a control signal to the power adjusting device to adjust the input current of the element) based on a difference between the temperature threshold from the table lookup and the temperature reading sensed by the temperature sensor 26. For instance, if the temperature threshold is lower than the temperature reading, the controller may reduce the resistance of the power adjusting device (when the device is a variable resistor), such that the TEC element draws more power to provide more cooling to the IT component. As described herein, the thermal management system is a closed system in which power drawn by the TEC element may be drawn away from the IT component.

In one embodiment, the controller may also take into account other system characteristics while adjusting the power distribution. For example, when the TEC element is air-cooled (e.g., with a heat sink), the system may account for the ambient temperature such that during conditions in which the temperature is high, the system may provide more power to the TEC element to compensate for the high ambient temperature (e.g., in order to increase heat transfer into the ambient environment). In another embodiment, the system may base the adjustment on the COP of the TEC element, such that $P_{TEC}$ may maximize COP.

If, however, the temperature reading is (or is within a range of) the temperature threshold, the controller 28 may maintain power distribution between the IT component 25 and the TEC element 1 (e.g., by not adjusting the power device 22).

In one embodiment, the operations of process 30 may be performed during an initiation of the thermal management system. Specifically, the operations may be performed upon the IT component 25 beginning to draw input power to perform operations. At which point, the TEC element may not be drawing power (e.g., $S_2$ is open), and therefore the IT component may be operating at (or close to) an ambient temperature. Once the optimal temperature is determined, the controller may adjust the input power of the TEC element and/or the IT component (e.g., by closing $S_2$ and adjusting the power adjusting device 22, as described herein).

In another embodiment, the controller may perform the operations based on changes in the operational status of the IT component. In particular, each time the IT component's workload is adjusted (e.g., drawing less or more input power based on changes to the computational operations performed by the IT component), the controller may perform at least some of the operations to optimize power distribution for the changed conditions. For example, the controller may perform at least some of the operations based on an input power drawn by the IT component for performing a set of operations. The controller may determine the operational status of the IT component (e.g., periodically or in response to changes). For instance, the controller may determine whether the input power of the IT component has changed based on the load sensed by the load sensor. In this case, the IT component may perform different (e.g., more) operations than from before. In response to the changed input power, the controller may perform the operations of process 30 to determine a temperature threshold of the IT component at which power distribution is optimized based on the current temperature and the changed input power of the IT component. Once determined, the controller may adjust the input power to the TEC element and/or to the IT component (e.g., by controlling the power adjusting device to allow the TEC element to draw power away from the IT component). In which case, once the case temperature of the IT component reaches the optimal temperature, the IT component may continue to perform the operations while drawing less power, $P_{compute}$, since the lower temperature may reduce or eliminate $P_{leak}$.

Figure 4:
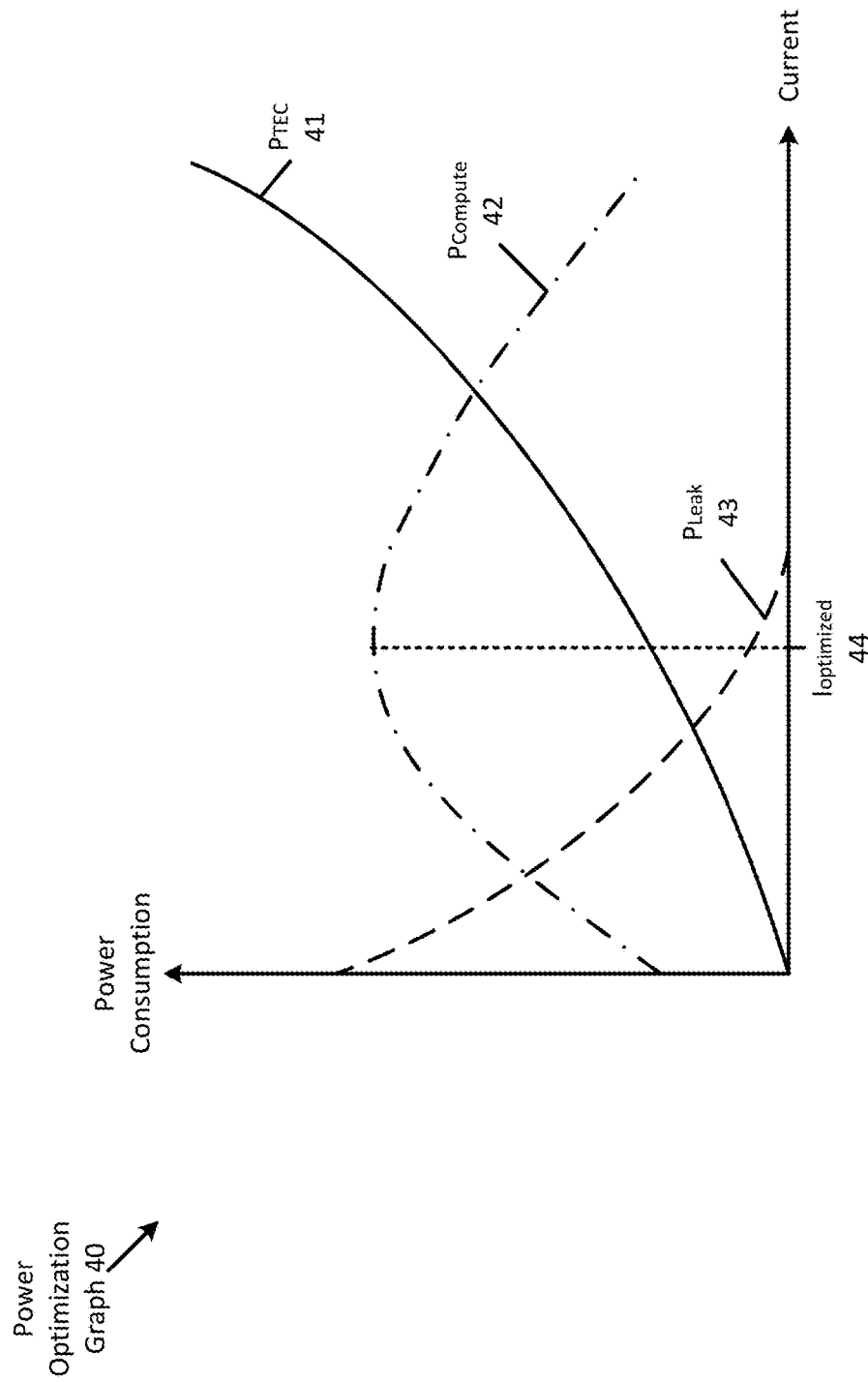
FIG. 4 is a power optimization graph according to one embodiment.

FIG. 4 is a power optimization graph 40 according to one embodiment. As described herein, the thermal management system determines how to optimally distribute power from power source 21 to (at least) the TEC element 1 and the IT component 25. Specifically, the thermal management system may perform a table lookup into a data structure (e.g., tuning table) that associates temperature thresholds with input power values (e.g., $P_{compute}$), where when the IT component is cooled at that temperature, power consumption by the component is maximized. In one embodiment, IT component efficiency may be expressed as $$\eta = \frac{P_{total} - (P_{TEC} + P_{leak})}{P_{total}}$$

Hence, the term $P_{TEC} P_{leak}$ must be reduced in order to achieve a high efficiency for $P_{compute}$, where the remainder of the power may be used to power the IT component, such that $P_{compute} = P_{total} - (P_{TEC} + P_{leak})$.

In one embodiment, tuning tables may be developed (e.g., in a controlled environment, such as a laboratory) based on computational data that is derived from characteristics of one or more elements (e.g., while under operational conditions) of the thermal management system (e.g., the TEC element, the IT component, etc.), while ensuring that η is as close to 1 as possible.

For example, the power optimization graph 40 illustrates power consumed by the thermal management system with respect to input current of the TEC element. In particular, the graph illustrates three input powers with respect to current, $P_{TEC}$ 41, $P_{compute}$ 42, and $P_{leak}$ 43. In one embodiment, each of the input powers may be a same scale or a different scale. As shown, as $P_{TEC}$ 41 increases from zero, $P_{leak}$ 43 decreases, which is a direct result of the core temperature of the IT component being reduced due to the increase in cooling capacity of the TEC element. In addition, as $P_{leak}$ 43 decreases, $P_{compute}$ 42 increases due to better efficiency of the IT component.

In one embodiment, all three input powers may equal the total output power of the power source, such that $P_{total} = P_{compute} P_{leak} + P_{TEC}$. Thus, Y-values of the three input powers along a same X-value equals $P_{total}$. As shown, the most optimal current to drive the TEC element, $I_{optimized}$ 44, is associated with the highest point of $P_{compute}$, which is the most optimized input power at which the IT component may operate most efficiently (e.g., where η is closest or at 1). From $I_{optimized}$ 44, a temperature threshold may be determined (e.g., by sensing the temperature while driving the TEC element with $I_{optimized}$44), with which the tuning tables may be generated.

As described thus far, the tuning tables may associate temperature thresholds with input power values of IT components. In some embodiments, the tables may associate optimized input current of the TEC element with input power values.

Figure 5:
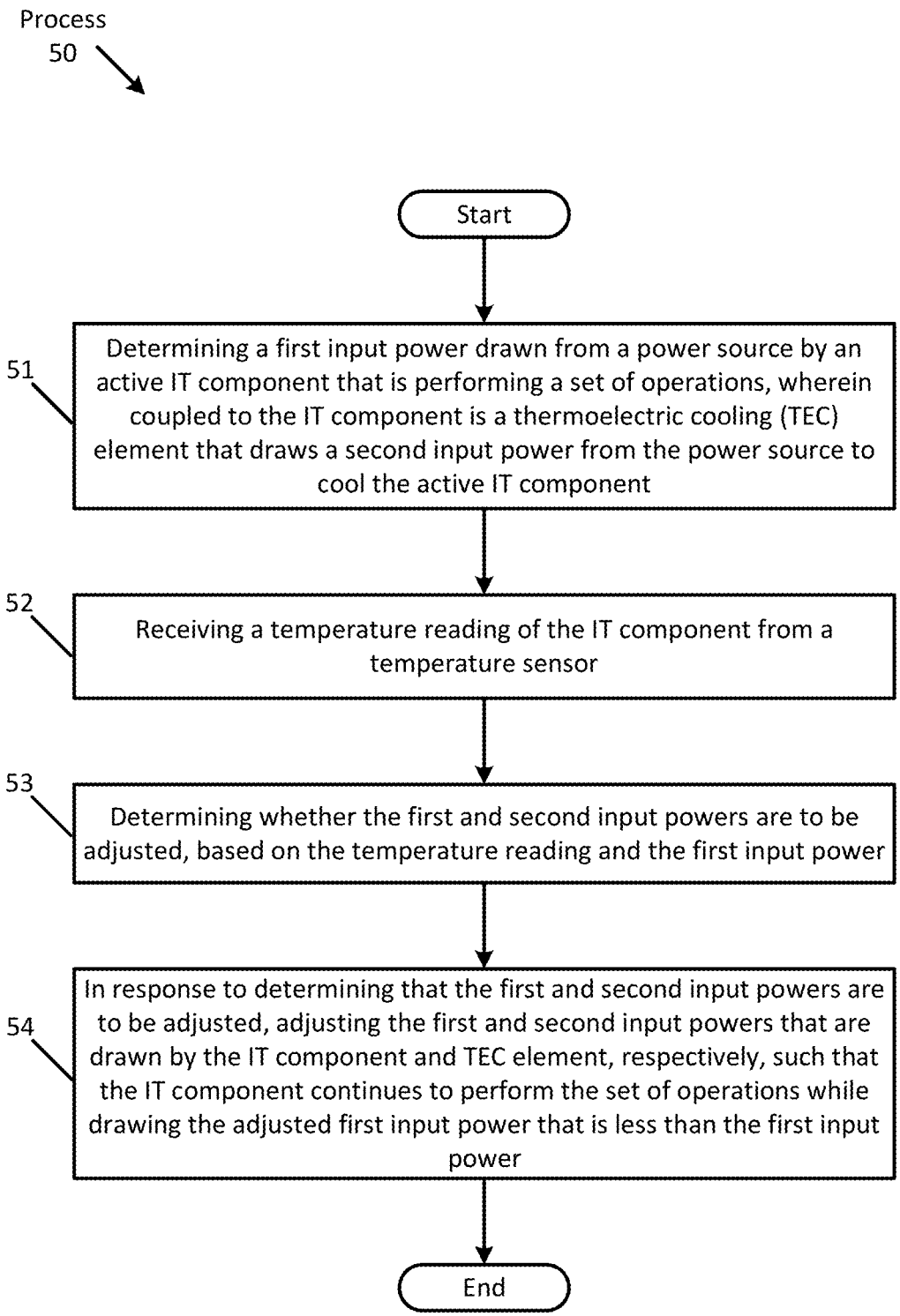
FIG. 5 is a flow chart of another process for distributing optimized power between the TEC element and IT component according to one embodiment.

FIG. 5 is a flow chart of a process 50 for distributing optimized power between the TEC element 1 and IT component 25 according to one embodiment. In one embodiment, the operations of this process may be performed by (e.g., the controller 28 of) the thermal management system 20, of FIG. 2. The process 50 begins by the controller determining a first input power drawn from a power source by an active IT component that is performing a set of operations, where coupled to the IT component is the TEC element that draws a second input power from the power source to cool the active IT component (at block 51). The controller receives a temperature reading of the IT component from a temperature sensor 26 (at block 52). The controller determines whether the first and second input powers are to be adjusted, based on the temperature reading and the first input power (at block 53). Specifically, the controller determines whether more or less input power should be supplied to the TEC element from the power source. For example, the controller may determine a temperature threshold at which the IT component is to operate while performing a set of operations by using the first input power to perform a table lookup into a data structure that associates input power values with temperature thresholds, and may determine whether the temperature reading of the IT component exceeds (or is less than) the determined temperature threshold that is associated with the first input power, as described in FIG. 3. In response to determining that the first and second input powers are to be adjusted, adjusting the first and second input powers that are drawn by the IT component and the TEC element, respectively, such that the IT component continues to perform the set of operations while drawing the adjusted first input power that is less than the first input power (at block 54). For example, during high-power conditions in which the IT component is drawing as much power from the power source as possible (e.g., close to or at $P_{total}$), the adjustment of the second input power to the TEC element effects the first input power drawn by the IT component. For example, the thermal management system may distribute power by rerouting some power drawn by the IT component into the TEC element by adjusting (or controlling) the power adjusting device 22, as described herein. Thus, the adjustment of first input power to the IT component may be in response to the adjustment of the power device 22, and/or may be inversely proportional to the increase of the TEC element.

Some embodiments may perform variations to the processes 30 and 50 of FIGS. 3 and 5, respectively. For example, the specific operations of the process may not be performed in the exact order shown and described. The specific operations may not be performed in one continuous series of operations and different specific operations may be performed in different embodiments. For example, some operations may be omitted, such as operations described in blocks with dashed borders (e.g., block 32). In this case, the controller 28 may be configured to determine (or adjust) power distribution between the TEC element and IT component based on the current operational status of the IT component (e.g., input power) and the temperature reading of the IT component, as described herein.

As described thus far, the thermal management system is configured to determine optimized power for the TEC element 1 and the IT component 25. In another embodiment, the operations may be performed to determine power optimization for multiple TEC elements that are coupled (or mounted) to multiple IT components. In this case, at least some of the operations may be performed in order to maximize $P_{compute}$ and minimize $P_{leak}$ of each of the IT components, while also minimizing $P_{TEC}$ of the TEC elements used to cool the components. Thus, in one example, when multiple TEC elements are cooling components, the system may determine different (or similar) temperatures that optimize performance of the TEC elements and the components from which the TEC elements are drawing heat.

Figure 6:
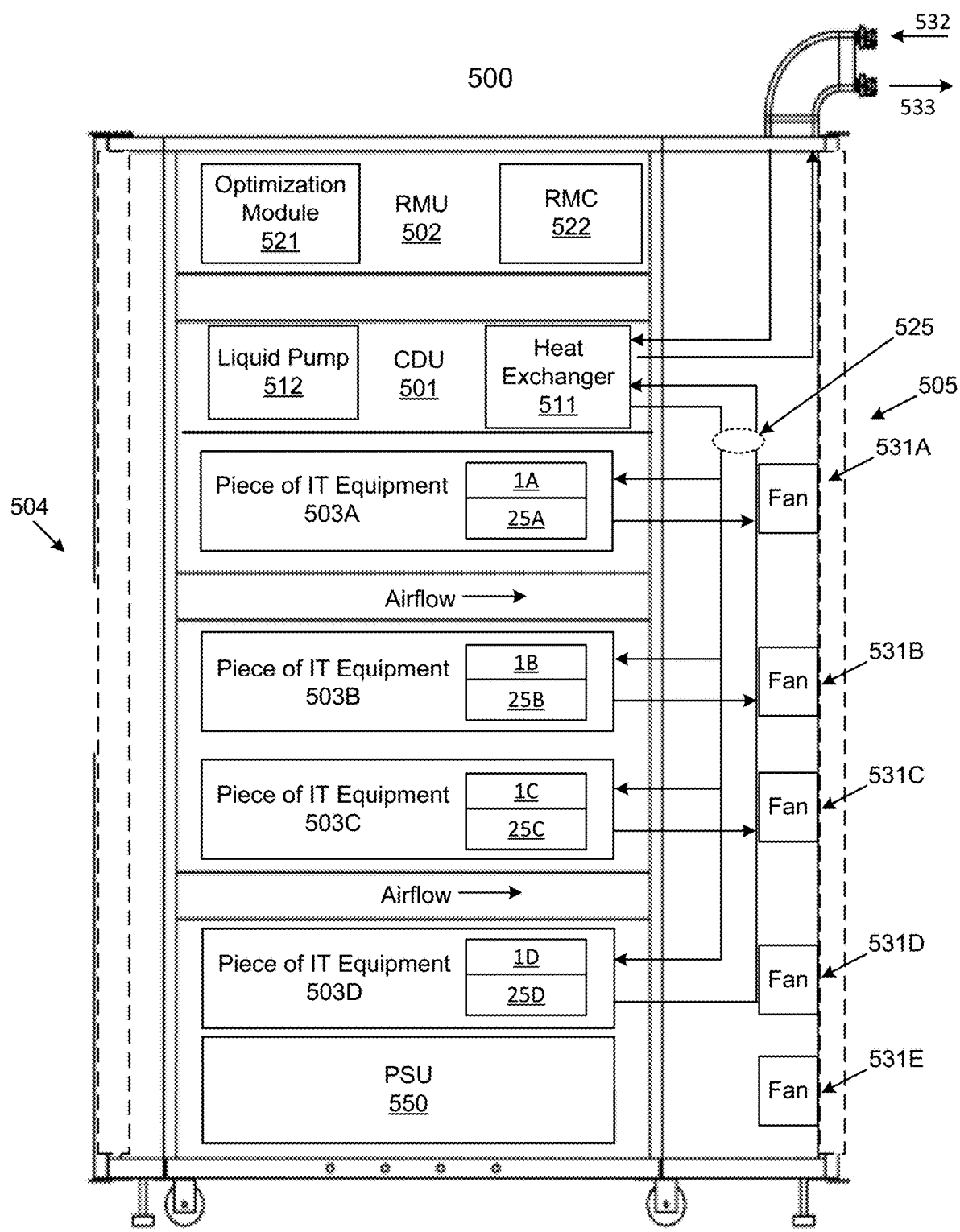
FIG. 6 is an example of an electronic rack according to one embodiment.

FIG. 6 is an example of an electronic rack according to one embodiment. Electronic rack 500 may include one or more server slots to contain one or more servers respectively. Each server includes one or more information technology (IT) components (e.g., processors, memory, storage devices, network interfaces). According to one embodiment, electronic rack 500 includes, but is not limited to, CDU 501, rack management unit (RMU) 502 (optional), a power supply unit (PSU) 550, and one or more pieces of IT equipment (or IT equipment) 503A-503D, which may be any type of IT equipment, such as server blades. The IT equipment 503 can be inserted into an array of server slots respectively from frontend 504 or backend 505 of electronic rack 500

Note that although there are only four pieces of IT equipment 503A-503D shown here, more or fewer pieces of IT equipment may be maintained within electronic rack 500. Also note that the particular positions of CDU 501, RMU 502, PSU 550, and IT equipment 503 are shown for the purpose of illustration only; other arrangements or configurations of these components. may also be implemented. Note that electronic rack 500 can be either open to the environment or partially contained by a rack container, as long as the cooling fans can generate airflows from the frontend to the backend (or generate airflows from the backend to the frontend).

In one embodiment, the rack 500 may include one or more electronic components of the thermal management system 20, illustrated in FIG. 2. For instance, the piece of IT equipment 24 may be one of the pieces of IT equipment 503A-503B. In addition, as shown, each of the pieces of IT equipment includes at least one TEC element 23 that is mounted on at least one IT component 25. In which case, the system 20 may provide cooling for (e.g., at least some of the components of) the electronic rack. In one embodiment, the controller 28 may be mounted within the rack 500 (e.g., as one of the pieces of IT equipment).

In addition, a fan module can be associated with each of the pieces of IT equipment 503, and the PSU module. In this embodiment, fan modules 531A-531E, collectively referred to as fan modules 531, and are associated with the pieces of IT equipment 503A-503D and the PSU, respectively. Each of the fan modules 531 includes one or more cooling fans. Fan modules 531 may be mounted on the backends of IT equipment 503 to generate airflows flowing from frontend 504, traveling through the rack 500, and existing at backend 505 of electronic rack 500. In another embodiment, one or more of the fan modules may be positioned on the frontend 504 of the rack 500. Such frontend fans may be configured to push air into the mounted equipment.

In one embodiment, CDU 501 mainly includes heat exchanger 511, liquid pump 512, and a pump controller (not shown), and some other components such as a liquid reservoir, a power supply, monitoring sensors and so on. Heat exchanger 511 may be a liquid-to-liquid heat exchanger. Heat exchanger 511 includes a first loop with inlet and outlet ports having a first pair of liquid connectors coupled to external liquid supply/return lines 532-533 to form a primary loop. The connectors coupled to the external liquid supply/return lines 532-533 may be disposed or mounted on backend 505 of electronic rack 500. The liquid supply/return lines 532-533 are coupled to a set of room manifolds, which are coupled to an external heat removal system, or external cooling loop. In addition, heat exchanger 511 further includes a second loop with two ports having a second pair of liquid connectors coupled to liquid manifold 525 to form a secondary loop, which may include a supply manifold to supply cooling liquid to the pieces of IT equipment 503 and a return manifold to return warmer liquid back to CDU 501. Note that CDUs 501 can be any kind of CDUs commercially available or customized ones. Thus, the details of CDUs 501 will not be described herein.

Each of the pieces of IT equipment 503 include one or more IT components 25 (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. IT equipment 503 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 500 further includes optional RMU 502 configured to provide and manage power supplied to servers 503, fan modules 531, and CDU 501. Optimization module 521 and RMC 522 can communicate with a controller in some of the applications. RMU 502 may be coupled to PSU 550 to manage the power consumption of the PSU. The PSU 550 may include the necessary circuitry (e.g., an alternating current (AC) to direct current (DC) or DC to DC power converter, backup battery, transformer, or regulator, etc.) to provide power to the rest of the components of electronic rack 500.

In one embodiment, the electronic rack 500 may draw power from the AC mains to power electronics mounted therein. In another embodiment, the rack may draw power from one or more renewable power sources, such as power source 21 of FIG. 2. In this case, the electronic rack may draw power from one or more renewable energy sources (e.g., PV systems), and supply the pieces of IT equipment 503, IT components 25, and TEC elements 1 coupled to the IT components to provide cooling capabilities. In one embodiment, the PSU may be electrically coupled to a power source, such as source 21 illustrated in FIG. 2.

In one embodiment, RMU 502 includes optimization module 521 and rack management controller (RMC) 522. RMC 522 may include a monitor to monitor operating status of various components within electronic rack 500, such as, for example, the pieces of IT equipment 503, CDU 501, and fan modules 531. Specifically, the monitor receives operating data from various sensors representing the operating environments of electronic rack 500. For example, the monitor may receive operating data representing temperatures of the processors, cooling liquid, and airflows, which may be captured and collected via various temperature sensors. The monitor may also receive data representing the fan power and pump power generated by the fan modules 531 and liquid pump 512, which may be proportional to their respective speeds. These operating data are referred to as real-time operating data. Note that the monitor may be implemented as a separate module within RMU 502.

Based on the operating data, optimization module 521 performs an optimization using a predetermined optimization function or optimization model to derive a set of optimal fan speeds for fan modules 531 and an optimal pump speed for liquid pump 512, such that the total power consumption of liquid pump 512 and fan modules 531 reaches minimum, while the operating data associated with liquid pump 512 and cooling fans of fan modules 531 are within their respective designed specifications. Once the optimal pump speed and optimal fan speeds have been determined, RMC 522 configures liquid pump 512 and cooling fans of fan modules 531 based on the optimal pump speed and fan speeds.

As an example, based on the optimal pump speed, RMC 522 communicates with a pump controller of CDU 501 to control the speed of liquid pump 512, which in turn controls a liquid flow rate of cooling liquid supplied to the liquid manifold 525 to be distributed to at least some of server blades 503. Therefore, the operating condition and the corresponding cooling device performance are adjusted. Similarly, based on the optimal fan speeds, RMC 522 communicates with each of the fan modules 531 to control the speed of each cooling fan of the fan modules 531, which in turn control the airflow rates of the fan modules 531. Note that each of fan modules 531 may be individually controlled with its specific optimal fan speed, and different fan modules and/or different cooling fans within the same fan module may have different optimal fan speeds.

Note that some or all of the IT equipment 503 (e.g., 503A, 503B, 503C, and/or 503D) may utilize different cooling methods. For instance, one server may utilize air cooling while another server may utilize liquid cooling. Alternatively, one IT component of a server may utilize air cooling while another IT component of the same server may utilize liquid cooling. In another embodiment, at least one of the pieces of IT equipment may be cooled by utilising one or more TEC elements, as described herein.

As previously explained, an embodiment of the disclosure may be (or include) a non-transitory machine-readable medium (such as microelectronic memory) having stored thereon instructions, which program one or more data processing components (generically referred to here as a "processor") to perform power optimization operations, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain embodiments have been described and shown in the accompanying drawings, it is to be understood that such embodiments are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some embodiments, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some embodiments, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A thermal management system for an electronic rack, the thermal management system comprising:
a thermoelectric cooling (TEC) element that is mounted to an information technology (IT) component of the electronic rack, wherein the TEC element and the IT component are electrically coupled to a power source, wherein the TEC element draws a first input power from the power source that cools the IT component;

a load sensor that is arranged to sense a second input power that is drawn by the IT component from the power source to perform a first set of operations;

a temperature sensor that is arranged to sense a temperature of the IT component; and a controller that is configured to determine whether the second input power drawn by the IT component has changed based on the load sensor, wherein the IT component performs a second set of operations while drawing the changed second input power, and in response to the changed second input power, adjust the first input power that is drawn by the TEC element to adjust an amount that the TEC element cools the IT component, resulting in a changed second input power that is drawn from the IT component, the adjusting of the first input power being based on the sensed temperature of the IT component and the changed second input power, wherein the IT component continues to perform the second set of operations while drawing the adjusted second input power that is less than the changed second input power.

2. The thermal management system of claim 1, wherein the power source is a photovoltaic (PV) system that includes a PV panel that is arranged to convert solar radiation into output power for the IT component and the TEC element.

3. The thermal management system of claim 1, wherein the TEC element and the IT component are electrically coupled in parallel to the power source, wherein the thermal management system further comprises a power adjusting device that is coupled between the power source and the TEC element, wherein the controller adjusts the first and second input powers by transmitting a control signal to the power adjusting device to provide the adjusted first input power drawn to the TEC element.

4. The thermal management system of claim 3, wherein the second input power to the IT component changes inversely proportional to the adjustment of the first input power.

5. The thermal management system of claim 3, wherein the power adjusting device is either an adjustable resistance device or a power switching device.

6. The thermal management system of claim 1, wherein the controller is configured to determine a temperature threshold at which the IT component is to operate while performing the second set of operations by using the changed second input power to perform a table lookup into a data structure that associates input power values with temperature thresholds, wherein the controller adjusts the first input power and the changed second input power based on a difference between the temperature threshold that is associated with the changed second input power and the temperature sensed by the temperature sensor.

7. A method for cooling an information technology (IT) component, the method comprising:

determining a first input power drawn from a power source by an active IT component that is performing a set of operations, wherein coupled to the IT component is a thermoelectric cooling (TEC) element that draws a second input power from the power source that cools the active IT component;

receiving a temperature reading of the IT component from a temperature sensor;

determining whether the first and second input powers are to be adjusted, based on the temperature reading of the IT component and the first input power; and in response to determining that the first and second input powers are to be adjusted, adjusting the second input power that is drawn by the TEC element to adjust an amount that the TEC elements cools the IT component, resulting in an adjustment to the first input power drawn by the IT component, such that the IT component continues to perform the set of operations while drawing the adjusted first input power that is less than the first input power.

8. The method of claim 7, wherein the power source is a photovoltaic (PV) system that includes a PV panel that is arranged to convert solar radiation into output power for the IT component and the TEC element.

9. The method of claim 7, wherein the TEC element and the IT component are electrically coupled in parallel to the power source, wherein coupled between the TEC element and the power source is a power adjusting device, wherein adjusting the first input power and the second input power comprises transmitting a control signal to the power adjusting device to provide the adjusted second input power to the TEC element.

10. The method of claim 9, wherein first input power drawn by the IT component is inversely proportional to the adjustment of the second input power.

11. The method of claim 9, wherein the power adjusting device is either an adjustable resistance device or a power switching device.

12. The method of claim 7, wherein determining whether the first and second input powers are to be adjusted comprises:

determining a temperature threshold at which the IT component is to operate while performing the set of operations by using the first input power to perform a table lookup into a data structure that associates input power values with temperature thresholds; and determining whether the temperature reading exceeds the determined temperature threshold that is associated with the first input power.

13. The method of claim 7, wherein determining the first input power drawn from the power source by the active IT component comprises determining a computing workload of the IT component that includes the set of operations that are to be performed by the IT component, wherein the first input power is determined according to the computing workload.

14. A non-transitory machine-readable medium having instructions stored therein, which when executed by a processor, causes the processor to perform operations, the operations comprising:

determining a first input power drawn from a power source by an active IT component that is performing a set of operations, wherein coupled to the IT component is a thermoelectric cooling (TEC) element that draws a second input power from the power source that cools the active IT component;

receiving a temperature reading of the IT component from a temperature sensor;

determining whether the first and second input powers are to be adjusted, based on the temperature reading and the first input power; and in response to determining that the first and second input powers are to be adjusted, adjusting the first input power that is drawn by the TEC element to adjust an amount that the TEC element cools the IT component, resulting in an adjustment to the first input power drawn by the IT component, such that the IT component continues to perform the set of operations while drawing the adjusted first input power that is less than the first input power.

15. The non-transitory machine-readable medium of claim 14, wherein the power source is a photovoltaic (PV) system that includes a PV panel that is arranged to convert solar radiation into output power for the IT component and the TEC element.

16. The non-transitory machine-readable medium of claim 14, wherein the TEC element and the IT component are electrically coupled in parallel to the power source, wherein coupled between the TEC element and the power source is a power adjusting device, wherein adjusting the first input power and the second input power comprises transmitting a control signal to the power adjusting device to provide the adjusted second input power to the TEC element.

17. The non-transitory machine-readable medium of claim 16, wherein the first input power drawn by the IT component is inversely proportional to the adjustment of the second input power.

18. The non-transitory machine-readable medium of claim 16, wherein the power adjusting device is either an adjustable resistance device or a power switching device.

19. The non-transitory machine-readable medium of claim 14, wherein determining whether the first and second input powers are to be adjusted comprises:
determining a temperature threshold at which the IT component is to operate while performing the set of operations by using the first input power to perform a table lookup into a data structure that associates input power values with temperature thresholds; and
determining whether the temperature reading exceeds the determined temperature threshold that is associated with the first input power.

20. The non-transitory machine-readable medium of claim 14, wherein determining the first input power drawn from the power source by the active IT component comprises determining a computing workload of the IT component that includes the set of operations that are to be performed by the IT component, wherein the first input power is determined according to the computing workload.

* * * * *